United States Patent
Morris et al.

(10) Patent No.: US 10,811,364 B2
(45) Date of Patent: Oct. 20, 2020

(54) SHIELDED ELECTRONIC MODULES AND METHODS OF FORMING THE SAME UTILIZING PLATING AND DOUBLE-CUT SINGULATION

(71) Applicant: Qorvo US, Inc., Greensboro, NC (US)

(72) Inventors: Thomas Scott Morris, Lewisville, NC (US); Stephen Craig Parker, Burlington, NC (US); Jerry Holt, Hillsborough, NC (US); John Davisson, Kernersville, NC (US); Rommel Quintero Nevarez, High Point, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/356,590

(22) Filed: Mar. 18, 2019

(65) Prior Publication Data

US 2020/0303318 A1    Sep. 24, 2020

(51) Int. Cl.
| | | |
|---|---|---|
| *H01L 23/552* | (2006.01) | |
| *H01L 23/31* | (2006.01) | |
| *H01L 23/00* | (2006.01) | |
| *H01L 21/768* | (2006.01) | |
| *H01L 21/56* | (2006.01) | |

(52) U.S. Cl.
CPC .......... *H01L 23/552* (2013.01); *H01L 21/561* (2013.01); *H01L 21/565* (2013.01); *H01L 21/76873* (2013.01); *H01L 21/76874* (2013.01); *H01L 23/3128* (2013.01); *H01L 24/96* (2013.01); *H01L 24/97* (2013.01)

(58) Field of Classification Search
CPC ............. H01L 21/565; H01L 21/76874; H01L 23/552; H01L 23/3128; H01L 23/49844; H01L 23/3121; H01L 23/3107; H01L 23/3135; H01L 23/562; H01L 24/96; H01L 24/97; H01L 25/043; H01L 25/0657; H01L 25/0756
See application file for complete search history.

(56) References Cited

U.S. PATENT DOCUMENTS

| | | | |
|---|---|---|---|
| 2018/0323170 A1* | 11/2018 | Kim ........................ | H01L 25/50 |
| 2019/0104653 A1* | 4/2019 | Jandzinski ........... | H05K 9/0088 |
| 2019/0164938 A1* | 5/2019 | Lee ....................... | H01L 23/552 |

* cited by examiner

*Primary Examiner* — Hsien Ming Lee
(74) *Attorney, Agent, or Firm* — Withrow & Terranova, P.L.L.C.

(57) ABSTRACT

The present disclosure relates to a shielded electronic module, which includes a module substrate, an electronic component attached to a top surface of the module substrate and encapsulated by a first mold compound, a second mold compound over a bottom surface of the module substrate, and a shielding structure. The second mold compound includes a recess extending inwardly from a bottom periphery of the second mold compound. The shielding structure completely covers a top surface of the module and extends over the side surface of the module until reaching the recess. Herein, the shielding structure is electrically grounded.

10 Claims, 11 Drawing Sheets

SHIELDED ELECTRONIC MODULES AND METHODS OF FORMING THE SAME UTILIZING PLATING AND DOUBLE-CUT SINGULATION

FIELD OF THE DISCLOSURE

The disclosure relates to shielded electronic modules and a fabrication process for making the same, and more particularly to a fabrication process to provide electronic modules with electromagnetic shielding utilizing plating and double-cut singulation.

BACKGROUND

As our world becomes more electronic through the introduction and the prevalence of electronic devices, the presence and strength of electromagnetic fields and signals also becomes more prevalent. While many such devices depend on these signals to work, they can also include multiple components which can be damaged, interfered with, or rendered inoperable by electromagnetic fields emitted from alternative components or devices. Also of concern is the emission of unwanted electromagnetic fields which may be intercepted by, disrupted by, or interfered with the operation of alternative devices or equipment.

One effective approach to minimizing the disruption of electromagnetic fields is to provide electromagnetic interference shielding, often known as EMI shielding. The shielding typically comes in the form of a grounded enclosure which at least partially blocks or encompasses the electronic component contained therein. The grounded enclosure or shield then blocks or absorbs incoming or outgoing electromagnetic fields or signals which could disrupt the electronic component within the housing or any electromagnetic fields or signals, and may have unwanted effects if transmitted outwardly.

Further, it has been recognized that wafer fabrication in which multiple electronic components are fabricated in close proximity to one another can have various limitations with regard to the density at which they can be provided on a wafer merely due to the limitations in cutting or saw blade thicknesses during singulation operations. Plating techniques utilized to provide the electromagnetic shield layer or enclosure can also have an effect on density of components on a wafer and effectiveness of the electromagnetic shield.

SUMMARY

The present disclosure relates to a shielded electronic module and a fabrication process for making the same. The disclosed shielded electronic module is formed from a non-shielded module and a shielding structure. The non-shielded module includes a module substrate, at least one electronic component, a first mold compound, and a second mold compound. The at least one electronic component is attached to a top surface of the module substrate. The first mold compound resides over the top surface of the module substrate and encapsulates the at least one electronic component. The second mold compound resides over the bottom surface of the module substrate and includes at least one recess extending inwardly from a bottom periphery of the second mold compound. Herein, a top surface of the non-shielded module is a top surface of the first mold compound, a bottom surface of the non-shielded module is a bottom surface of the second mold compound, and a side surface of the non-shielded module is a combination of a side surface of the first mold compound, a side surface of the module substrate, and a side surface of the second mold compound. The shielding structure completely covers the top surface of the non-shielded module, extending over the side surface of the non-shielded module until reaching the at least one recess. The shielding structure is electrically grounded.

In one embodiment of the shielded electronic module, the non-shielded module further includes a number of module contacts formed at the bottom surface of the module substrate. The second mold compound encapsulates sides of each module contact, such that a bottom portion of each module contact is not covered by the second mold compound.

In one embodiment of the shielded electronic module, the at least one recess and the bottom surface of the module are exposed and not covered by the shielding structure.

In one embodiment of the shielded electronic module, the shielding structure includes a first layer and a second layer. The first layer completely covers the top surface of the non-shielded module and extends over the side surface of the non-shielded module until the at least one recess. The first layer is formed of copper, aluminum, silver, or gold. The second layer is over the first layer and formed of nickel.

In one embodiment of the shielded electronic module, a thickness of the first layer is between 0.5 µm and 16 µm, and a thickness of the second layer is between 0.5 µm and 3 µm.

In one embodiment of the shielded electronic module, the shielding structure includes a seed layer, a first layer, and a second layer. The seed layer completely covers the top surface of the non-shielded module and extends over the side surface of the non-shielded module until the at least one recess. The seed layer is formed of copper, aluminum, silver, or gold. The first layer is over the seed layer and formed of copper, aluminum, silver, or gold. The second layer is over the first layer and formed of nickel.

In one embodiment of the shielded electronic module, the shielding structure comprises stainless steel materials.

In one embodiment of the shielded electronic module, the at least one recess has a horizontal depth between 1 µm and 35 µm.

In one embodiment of the shielded electronic module, the module substrate further includes at least one grounded conductive element. The at least one grounded conductive element is positioned at a periphery of the module substrate and exposed at the side surface of the module substrate, such that the shielding structure is in contact with the at least one grounded conductive element.

In one embodiment of the shielded electronic module, the non-shielded module further includes a number of external contacts. Each external contact is connected to a corresponding module contact at the bottom surface of the second mold compound.

According to an exemplary process, a double-sided package having a number of modules is provided first. Herein, an inter-module area is in between two adjacent modules. Each module includes a module substrate, at least one electronic component attached to a top surface of the module substrate and encapsulated by a first mold compound, and a number of module contacts formed at a bottom surface of the module substrate and encapsulated by a second mold compound. The module substrate includes at least one grounded conductive element, and the at least one grounded conductive element is positioned at a periphery of the module substrate, such that the at least one grounded conductive element is adjacent to an edge of a corresponding inter-module area. Next, the double-sided package is sub-diced at each inter-module area to create an elongated cavity. The double-sided package is sub-diced from a top surface of the double-sided package toward a bottom surface of the double-sided package. The elongated cavity extends vertically from the top surface of the double-sided package toward the bottom surface of the double-sided package without extending completely through the second mold compound. The at least one grounded conductive element associated with each module is exposed to a corresponding elongated cavity. A shielding structure is then applied completely over the top surface of the double-sided package and exposed faces within each elongated cavity to form a shielded electronic package. The shielding structure is in contact with the at least one grounded conductive element associated with each module. At last, the shielded electronic package is singulated into a number of shielded electronic modules by dicing from the bottom surface of the second mold compound until reaching the bottom of each elongated cavity.

In one embodiment of the exemplary process, the double-sided package is sub-diced with a first blade, and the shielded electronic package is singulated with a second blade. Herein, the second blade is wider than the first blade.

In one embodiment of the exemplary process, at least one recess is formed during the singulating step at a bottom periphery of the second mold compound associated with each shielded electronic module. Herein, the shielding structure completely covers the top surface of each shielded electronic module, extends over a side surface of each shielded electronic module, and terminates at the at least one recess of the second mold compound associated with each shielded electronic module.

In one embodiment of the exemplary process, the at least one recess has a horizontal depth between 1 μm and 35 μm.

In one embodiment of the exemplary process, the elongated cavity formed during the sub-dicing step does not extend vertically beyond the module contacts.

According to another embodiment, the exemplary process further includes thinning the second mold compound to expose each module contact before the singulating step. Herein, a portion of the second mold compound remains underneath each elongated cavity.

According to another embodiment, the exemplary process further includes forming a number of external contacts at the bottom surface of the second mold compound. Each external contact is connected to a corresponding module contact.

In one embodiment of the exemplary process, singulating the shielded electronic package is provided by diamond cutting or laser cutting.

In one embodiment of the exemplary process, the shielding structure is formed by an electro/electroless plating process. Herein, the shielding structure includes a first layer formed of copper, aluminum, silver, or gold, and a second layer formed of nickel. The first layer completely covers the top surface of the double-sided package and exposed faces within each elongated cavity. The second layer is over the first layer.

In one embodiment of the exemplary process, the shielding structure is formed by a sputter plating process. Herein, the shielding structure includes stainless steel materials.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
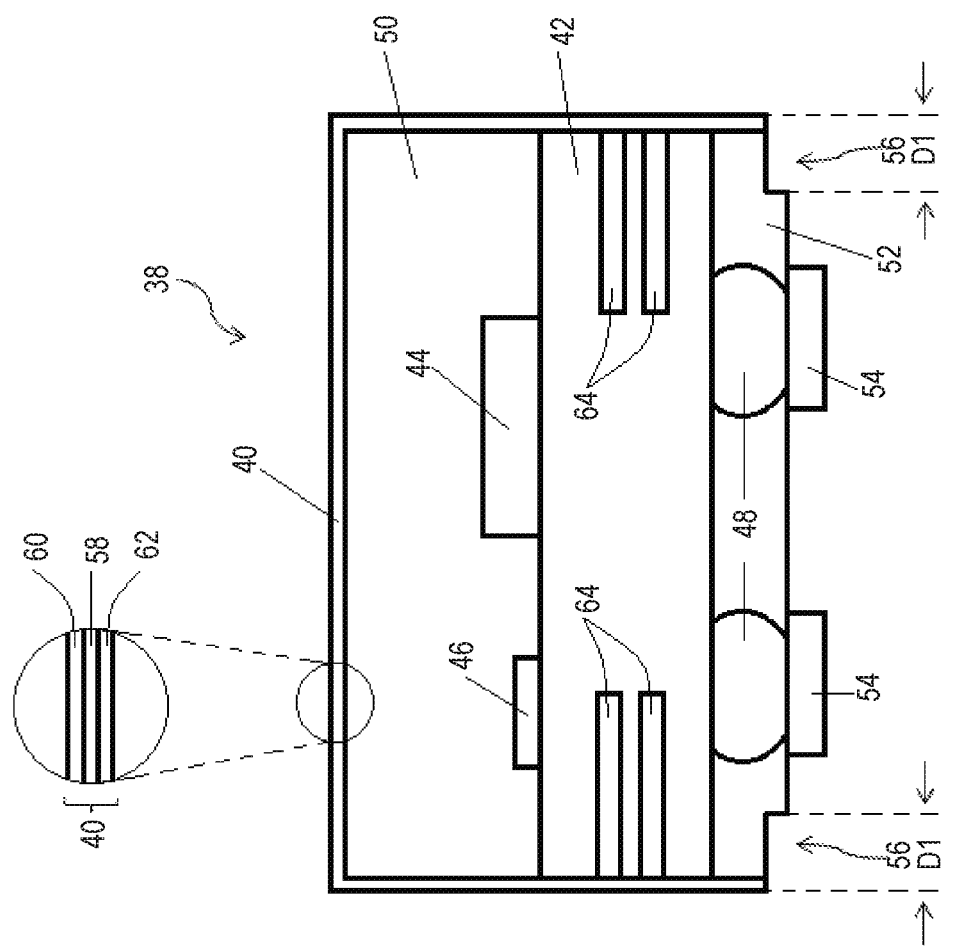
FIG. 2 illustrates an exemplary shielded electronic module according to one embodiment of the present disclosure.

FIGS. 3A-3I provide exemplary steps that illustrate a process to fabricate the exemplary shielded electronic module shown in FIG. 2.

It will be understood that for clear illustrations, FIG. 1A-3I may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "horizontal" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1A:
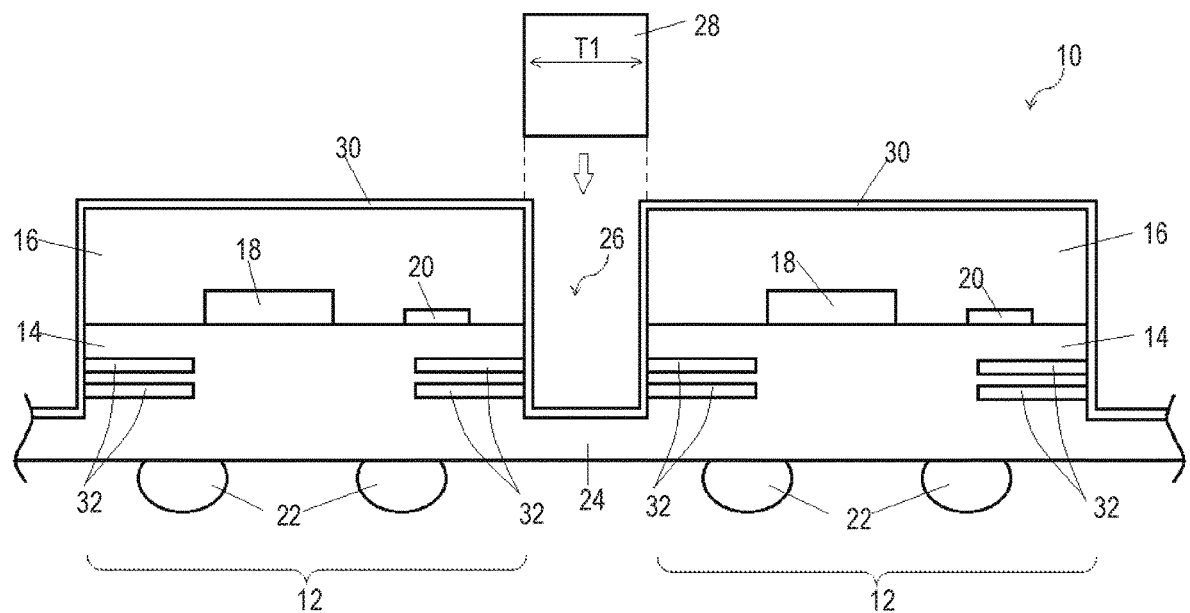
FIGS. 1A-1B illustrate an exemplary singulation step for forming shielded electronic modules.
Figure 1B:
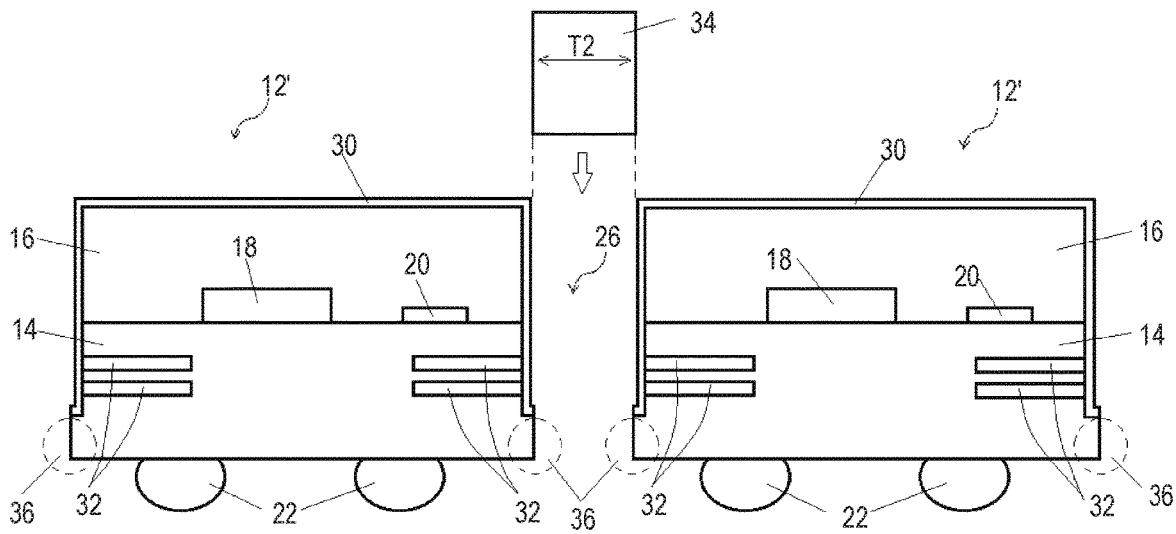

FIGS. 1A-1B are included herewith and will be discussed herein for purposes of illustrating the structural differences thereof and the structural differences achieved by utilizing the methods and the structures of the present invention.

In particular, FIG. 1A illustrates a wafer package 10 having multiple integrated electronic modules 12 provided thereon. Each integrated electronic module 12 includes a substrate 14, a molding compound 16, one or more electronic components 18 and 20, and multiple module contacts 22. The one or more electronic components 18 and 20 reside over a top surface of the substrate 14, the mold compound 16 covers the top surface of the substrate 14 to encapsulate the one or more electronic components 18 and 20, and the module contacts 22 are formed at a bottom surface of the substrate 14.

Herein, the adjacent integrated electronic modules 12 are connected to each other at a bottom portion of each substrate 14 with an inter-module substrate connection 24, while other portions of the adjacent integrated electronic modules 12 are separate by an elongated cavity 26. The elongated cavity 26 may be provided by a subdicing step with a first blade 28 from an upper side to a lower side of the wafer package 10. A thickness T1 of the first blade 28 is the same as a width of the elongated cavity 26. A shield structure 30 is provided over the wafer package 10, and completely covers the top surface of the wafer package 10, the side surface of the wafer package 10, and any exposed surfaces of each elongated cavity 26 without covering the bottom surface of the wafer package 10.

Each substrate 14 may include one or more grounded conductive elements 32 and other conductive vias/wirings (not shown). The grounded conductive elements 32 are positioned at a periphery of the substrate 14, and each grounded conductive element 32 is exposed to one elongated cavity 26. In this manner, the grounded conductive element 32 will be in contact with the shielding structure 30, so as to prevent unwanted emission or absorption of any electromagnetic signals or fields by the electronic components 18 and 20.

In one particular example, the shielding structure 30 may be provided by a sputter plating process, which results in a thicker top shielding and a thinner sidewall shielding. This variation in thickness is in part due to the difficulty in accessing the proper angles between the surfaces within the elongated cavity 26 and a sputter shielding emitter. For purposes of discussion, the sputter shielding may allow for a 3.5 μm shielding thickness on the top surface of each integrated electronic module 12, and a 1.5 μm shielding thickness about the side surfaces of the integrated electronic module 12 within the elongated cavity 26.

As illustrated in FIG. 1B, a singulation step is configured to provide a number of individual shielded electronic modules 12'. The singulation step is performed by cutting from the upper side of the wafer package 10 through the elongated cavity 26 with a second blade 34. As such, the inter-module substrate connection 24 between adjacent substrates 14 is removed. To allow for manufacturing tolerances between the side surfaces within the elongated cavity 26 and to not damage the shielding structure 30, the second blade 34 must be narrower than the elongated cavity 26 (thinner than the first blade 28). If the second blade 34 has a thickness T2, the thickness T1 of the first blade 28 (the width of the elongated cavity 26) must be larger than T2 plus twice the thickness of the shielding structure 30 along the side surfaces of the integrated electronic module 12. For the sputter plating process, the elongated cavity 26 must have a thickness larger than T2+3 μm (1.5 μm*2).

After the singulation step, lip portions 36 will be left at the bottom periphery of each substrate 14, which resides at least below the shielding structure 30. Further, depending on the manufacturing tolerance permitted between the shielding structure 30 and the second blade 34, the lip portion 36 may in some instances extend beyond the shielding structure 30 in the lateral direction. In which case, the lip portion extending laterally beyond the shielding structure 30 will require a polishing or removal step thus adding to manufacturing cost.

In another embodiment, the shielding structure 30 may be provided by an electro/electroless plating process, which results in a more uniform thickness between the top portion and the side portions of the shielding structure 30. However, the electro/electroless plating process will result in a relatively thicker shielding compared to sputter shielding. For purposes of discussion, electro/electroless plating typically results in exemplary thicknesses having a range of 5 μm-7 μm as opposed to the 3.5 μm top and 1.5 μm side thicknesses of sputter shielding. Consequently, the first blade 28 (the elongated cavity 26) must have a thickness larger than T2+14 μm (7 μm*2) for the electro/electroless plating process.

Herein, the subdicing step to form the elongated cavity 26 separating the electronic modules, and the singulation step to form individual shielded electronic modules 12' are performed from a same direction from the upper side to the lower side of the wafer package 10. The elongated cavity 26 formed by the first blade 28 must be wide enough to accommodate the second blade 28 and the shielding structure 30. Since the first blade 28 and the second blade 34 have minimum thickness constraints (otherwise prohibitively expensive), the electronic modules may not be placed with minimum distances. As such, the wafer package 10 may not accommodate a maximum number of integrated electronic modules 12.

Further, it is desired to maximize the distance between the electronic components 18/20 from the shielding structure 30. As seen herein, the minimum distance between the electronic components 18/20 from the shielding structure 30 is limited in part by the thickness of the second blade 34 performing the singulation step-cut as it must fit into the elongated cavity 26 with the associated shielding structure 30 formed on the sidewalls of the integrated electronic module 12 with sufficient clearance or tolerance so as to not damage the shielding structure 30. In many cases, a thinner blade is not available and a minimum spacing between the electronic components 18/20 and the shielding structure 30 is required, thus density of modules on the wafer must be reduced.

As will be understood by those having skill in the art, a saw or cutting blade used as the second blade 34 tends to pull material which may cause peeling or delamination of portions of the shielding structure 30. The saw blade may snag at an edge or a bottom portion at the cutting point thereof and pull the shielding structure 30 from the underlying substrate 14 or the mold compound 16. This delamination or peeling may then in some instances cause separation from the perimeter contacts as well as cause unwanted gaps in the shielding structure 30, which may render the final electronic module inoperable, improperly shielded, or otherwise useless.

In order to overcome the limitations described above, an exemplary shielded electronic module 38 according to one embodiment of the present disclosure, as illustrated in FIG. 2, is achieved by fabrication steps as illustrated in FIGS. 3A-3I. Although the fabrication steps are illustrated in a series, the fabrication steps are not necessarily order dependent. Some steps may be done in a different order than that presented. Further, processes within the scope of this disclosure may include fewer or more steps than those illustrated in FIGS. 3A-3I.

For the purpose of this illustration, the shielded electronic module 38 includes a shielding structure 40, a module substrate 42, a first electronic component 44, a second electronic component 46, module contacts 48, a first mold compound 50, and a second mold compound 52. In detail, the first electronic component 44 and the second electronic component 46 are attached to a top surface of the module substrate 42. In different applications, the shielded electronic module 38 may include fewer or more electronic components. The first electronic component 44/the second electronic component 46 may be a flip-chip die, a wire-bonding die, a surface mounted device (SMD), an inductor, or other active/passive component. The first mold compound 50 resides over the top surface of the module substrate 42 and encapsulates the first and second electronic components 44 and 46. The first mold compound 50 may be an organic epoxy resin system.

The module contacts 48 are attached to a bottom surface of the module substrate 42. In different applications, the shielded electronic module 38 may include one or more electronic components at the bottom surface of the module substrate (not shown). The module contacts 48 are conductive, and may be solder balls or copper pillars. The module contacts 48 may be used for grounded signals and/or non-grounded signals. The second mold compound 52 resides over the bottom surface of the module substrate 42 and partially encapsulates each module contact 48. A bottom portion of each module contact 48 is not covered by the second mold compound 52. In some applications, the shielded electronic module 38 may include a number of external contacts 54, each of which is connected to a corresponding module contact 48 at a bottom surface of the second mold compound 52. The second mold compound 52 may be formed from a same or different material as the first mold compound 50. In addition, there are recesses 56 formed at a bottom periphery of the second mold compound 52 and extending inwardly toward a central portion of the second mold compound 52. Each recess 56 may have a horizontal depth D1 between 1 μm and 35 μm.

In this embodiment, a top surface of the shielded electronic module 38 is a top surface of the first mold compound 50, a bottom surface of the shielded electronic module 38 is a bottom surface of the second mold compound 52, and a side surface of the shielded electronic module 38 is a combination of a side surface of the first mold compound 50, a side surface of the module substrate 42, and a side surface of the second mold compound 52. The shielding structure 40 completely covers the top surface of the shielded electronic module 38 and extends over the side surface of the shielded electronic module 38 until reaching the recesses 56. Each recess 56 and the bottom surface of the shielded electronic module 38 are exposed and not covered by the shielding structure 40.

In some applications, the shielding structure 40 may include a first layer 58 formed of copper, aluminum, silver, gold, or other conductive materials, and a second layer 60 formed of nickel. The first layer 58 completely covers the top surface of the shielded electronic module 38 and extends over the side surface of the shielded electronic module 38 until reaching the recesses 56. The first layer 58 may have a thickness between 0.5 μm and 16 μm. The second layer 60 resides over the first layer 58, and may have a thickness between 0.5 μm and 3 μm. In order to achieve a superior adhesion, the shielding structure 40 may further include a seed layer 62 formed of copper, aluminum, silver, gold, or other conductive materials with a thickness between 0.5 μm and 1.5 μm. The seed layer 62 may directly and completely cover the top surface of the shielded electronic module 38, and extends over the side surface of the shielded electronic module 38 until reaching the recesses 56. Herein, the first layer 58 resides over the seed layer 62, and the second layer 58 resides over the first layer 58. In some other applications, the shielding structure 40 may include stainless steel materials.

Further, the module substrate 42 may be a laminate having a number of layers (not shown for clarity). These laminate layers of the module substrate 42 may include prepreg material. The module substrate 42 also includes grounded conductive elements 64, each of which is positioned at a periphery of the module substrate 42 and exposed through the side surface of the module substrate 42, such that the shielding structure 40 is in contact with each grounded conductive element 64, and therefore electrically grounded. As used herein, the term "periphery" is defined to be the outermost part or region within a precise boundary, in particular, the boundary formed by the side surface of the module substrate 42.

FIGS. 3A-3I provide exemplary steps that illustrate a process to fabricate the exemplary shielded electronic module 38 shown in FIG. 2. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 3A-3I.

Figure 3A:
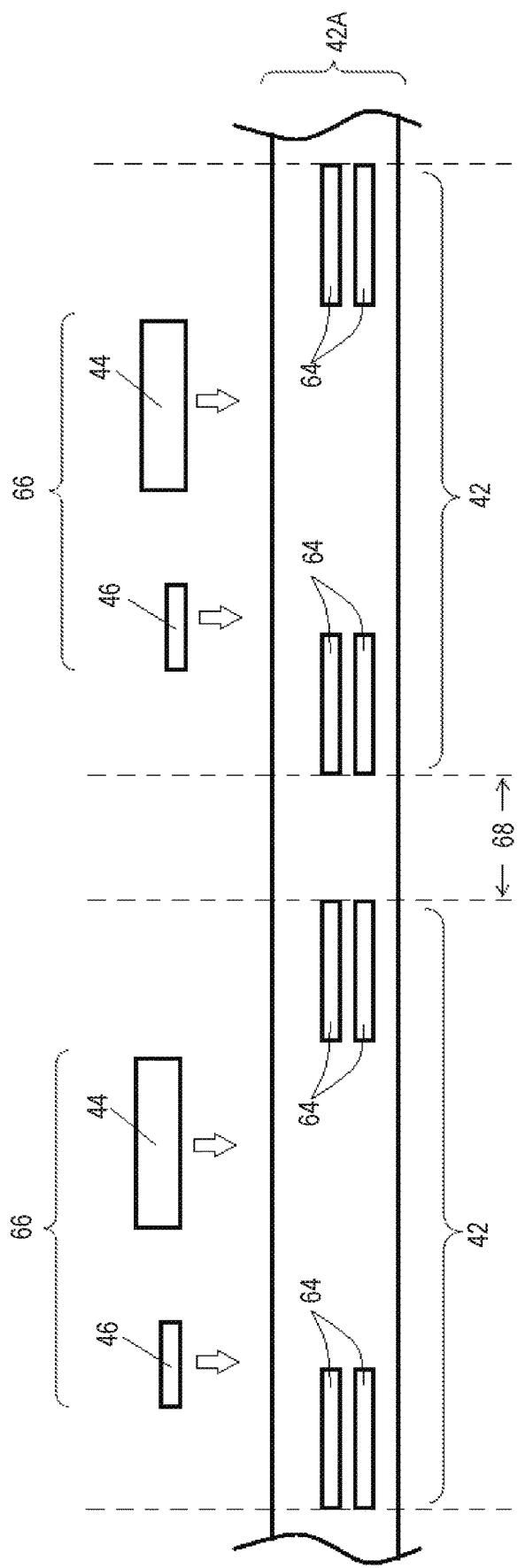

Initially, a number of electronic component groups 66 are attached to a top surface of a package substrate 42A as depicted in FIG. 3A. The electronic component groups 66 may be attached to the package substrate 42A via an adhesive material (not shown). The package substrate 42A includes a number of the module substrates 42, and a number of inter-module areas 68. Each inter-module area 68 is in between adjacent module substrates 42 and has a relatively small width. Herein, each electronic component group 66 is attached to a corresponding module substrate 42, and does not reside on any inter-module area 68. As described above, each module substrate 42 includes the grounded conductive element 64, each of which is positioned at the periphery of the module substrate 42, such that each grounded conductive element 64 is adjacent to an edge of one inter-module area 68 or exposed through a side surface of the package substrate 42A (not shown). In this embodiment, each electronic component group 66 includes the first electronic component 44 and the second electronic component 46. In different applications, each electronic component group 66 may include fewer or more top electronic components.

Figure 3B:
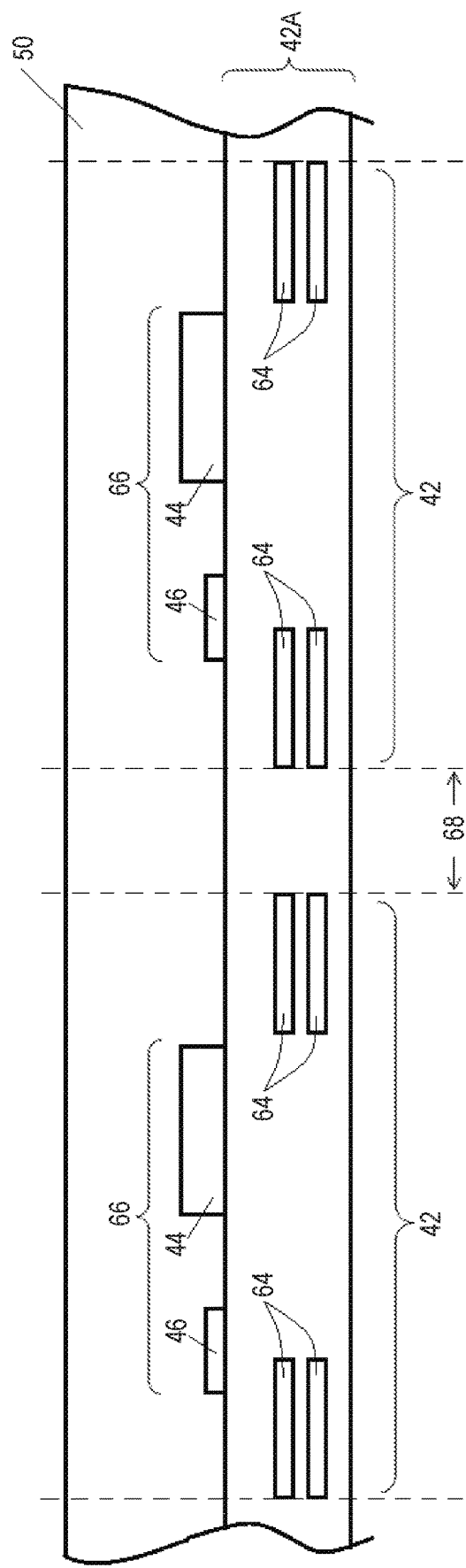

Next, the first mold compound 50 is applied over the top surface of the package substrate 42A to encapsulate each electronic component group 66 as depicted in FIG. 3B. The first mold compound 50 may be applied by various procedures, such as sheet molding, overmolding, compression molding, transfer molding, dam fill encapsulation, or screen print encapsulation. A curing process (not shown) is followed to harden the first mold compound 50. The curing temperature is between 100° C. and 320° C. depending on which material is used as the first mold compound 50.

Figure 3C:
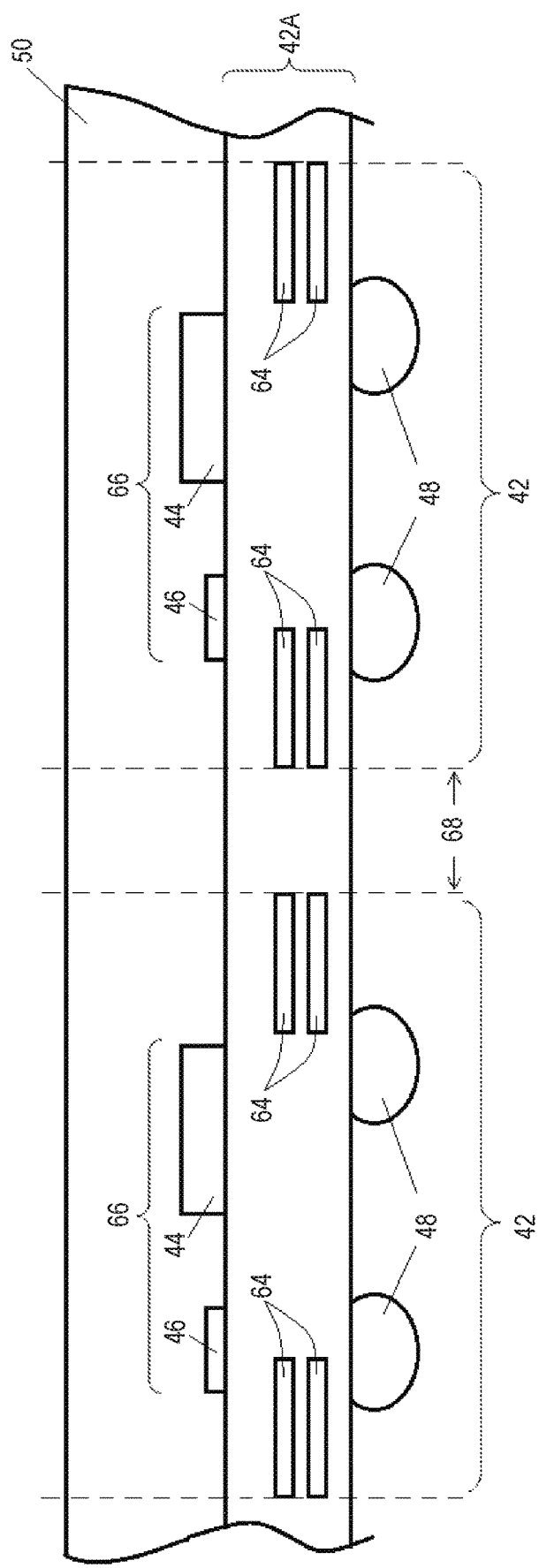
Figure 3D:
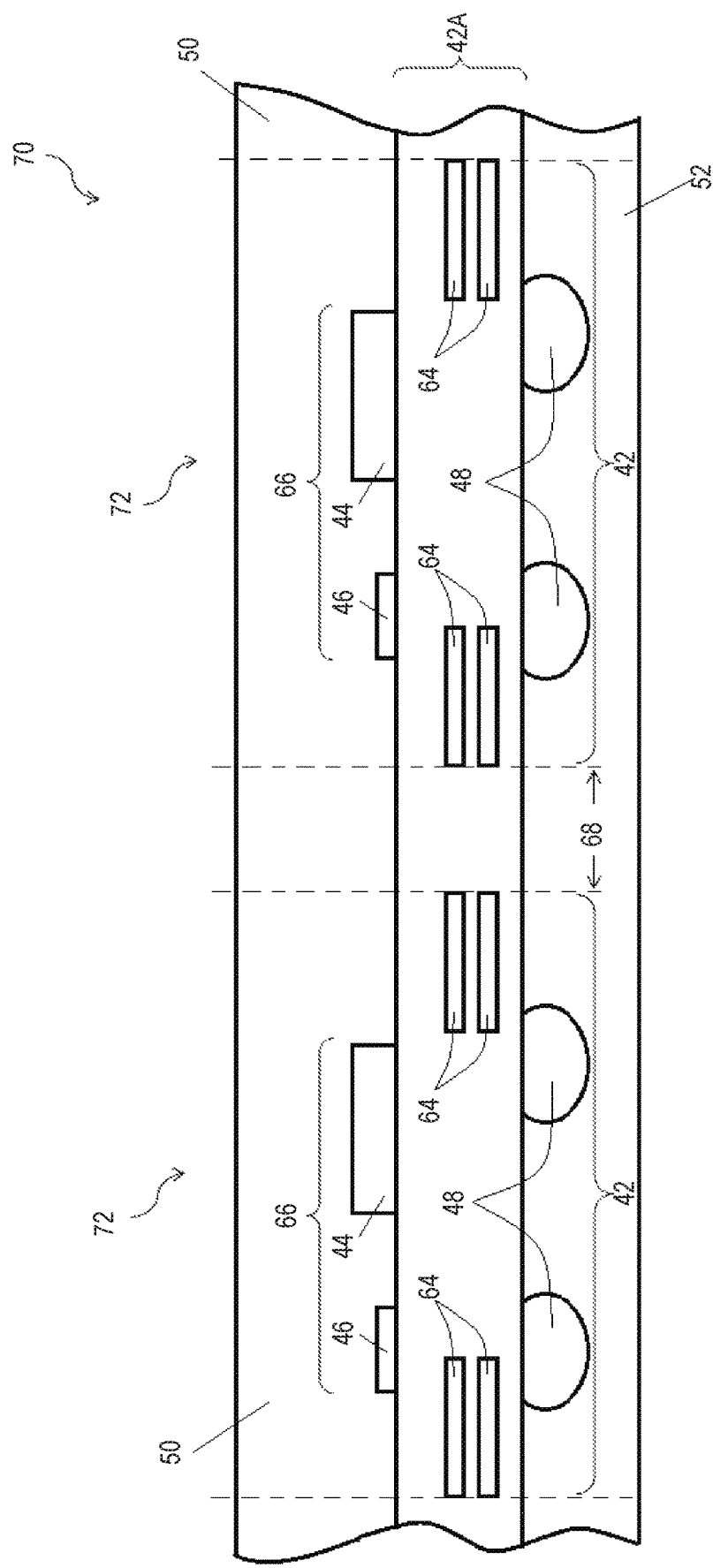

The module contacts 48 are then attached at the bottom surface of each module substrate 42 as depicted in FIG. 3C. In different applications, there may be one or more electronic components (not shown) attached to the bottom surface of each module substrate 42. Each module contact 48 may be used for grounded signals and/or non-grounded signals. Herein, none of the module contacts 48 resides underneath any inter-module area 68. After the module contacts 48 are attached, the second mold compound 52 is applied to form a double-sided package 70 as depicted in FIG. 3D. The second mold compound 52 resides over the bottom surface of the package substrate 42A to encapsulate each module contact 48. The second mold compound 52 may be formed from a same or different material as the first mold compound 50. The second mold compound 52 may be applied by various procedures, such as sheet molding, overmolding, compression molding, transfer molding, dam fill encapsulation, or screen print encapsulation. A curing process (not shown) is followed to harden the second mold compound 52. The curing temperature is between 100° C. and 320° C. depending on which material is used as the second mold compound 52.

Herein, the double-sided package 70 includes a number of double-sided modules 72, which share the package substrate 42A, the first mold compound 50, and the second mold compound 52. Each double-sided module 72 includes one module substrate 42, one electronic component group 66 attached to the top surface of the module substrate 42, and the module contacts 48 formed at the bottom surface of the corresponding module substrate 42. Further, a top surface of the double-sided package 70 is the top surface of the first mold compound 50, a bottom surface of the double-sided package 70 is the bottom surface of the second mold compound 52, and a side surface of the double-sided package 70 is a combination of the side surface of the first mold compound 50, the side surface of the package substrate 42A, and the side surface of the second mold compound 52.

Figure 3E:
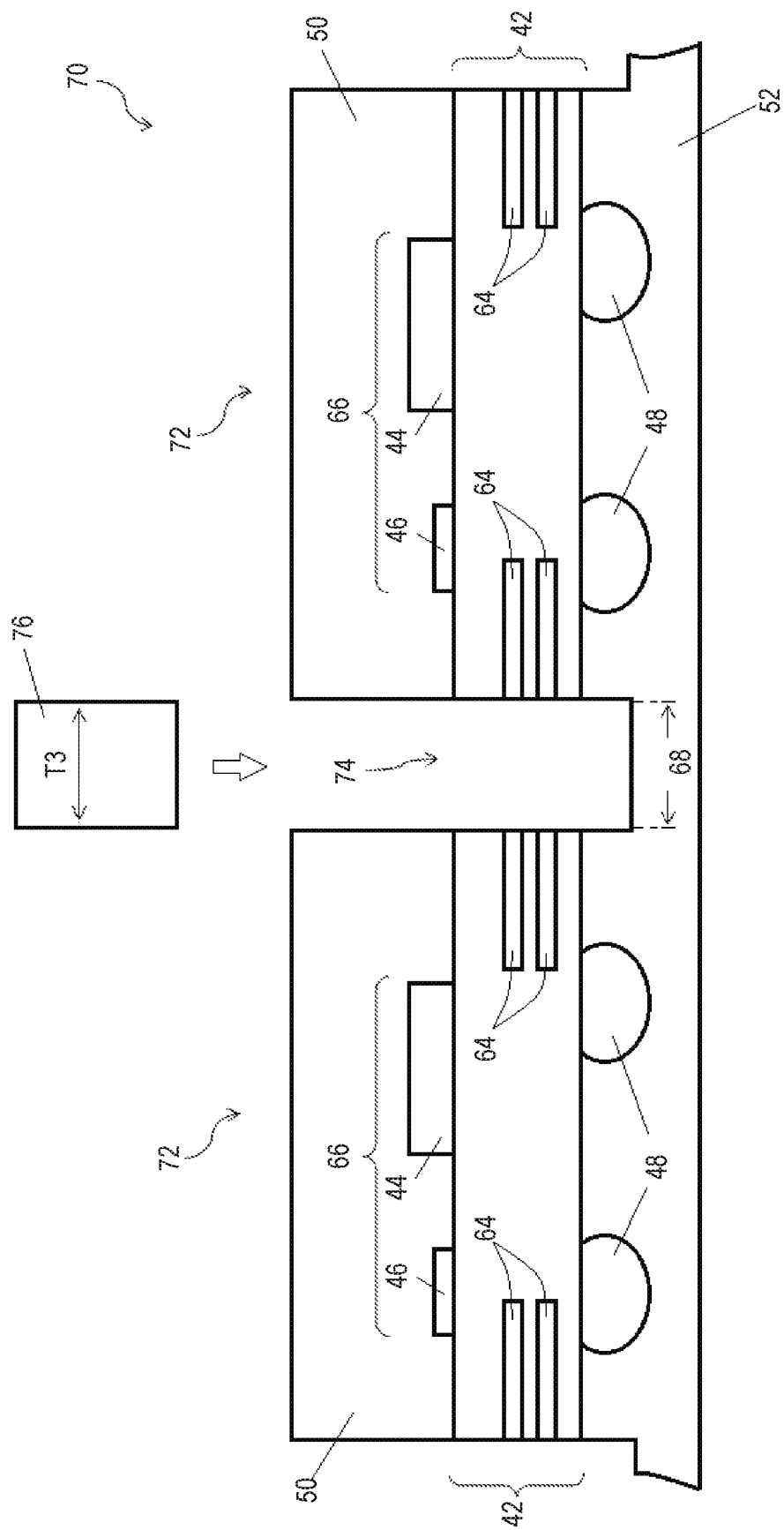

Next, the double-sided package 70 is sub-diced at each inter-module area 68 to create an elongated cavity 74 and partially separate each double-sided module 72, as depicted in FIG. 3E. The elongated cavity 74 may be provided by dicing with a first blade 76 from the top surface of the first mold compound 50, through the package substrate 42A, and into the second mold compound 52 without extending completely through the second mold compound 52. Herein, the elongated cavity 74 does not extend vertically beyond the module contacts 48, and each module contact 48 is still encapsulated by the second mold compound 28. A width of the elongated cavity 74 is the same as a thickness T3 of the first blade 76, which may have minimum thickness constraints (otherwise prohibitively expensive). The width of the elongated cavity 74 is wide enough, such that the grounded conductive elements 64 adjacent to the edge of any inter-module area 68 are exposed to the elongated cavity 74. In addition, the width of the elongated cavity 74 is not too wide so as to maximize a distance between the electronic components 44/46 from a periphery of the first mold compound 50. The width of the elongated cavity 74 may be wider than or equal to the width of the inter-module area 68.

Figure 3F:
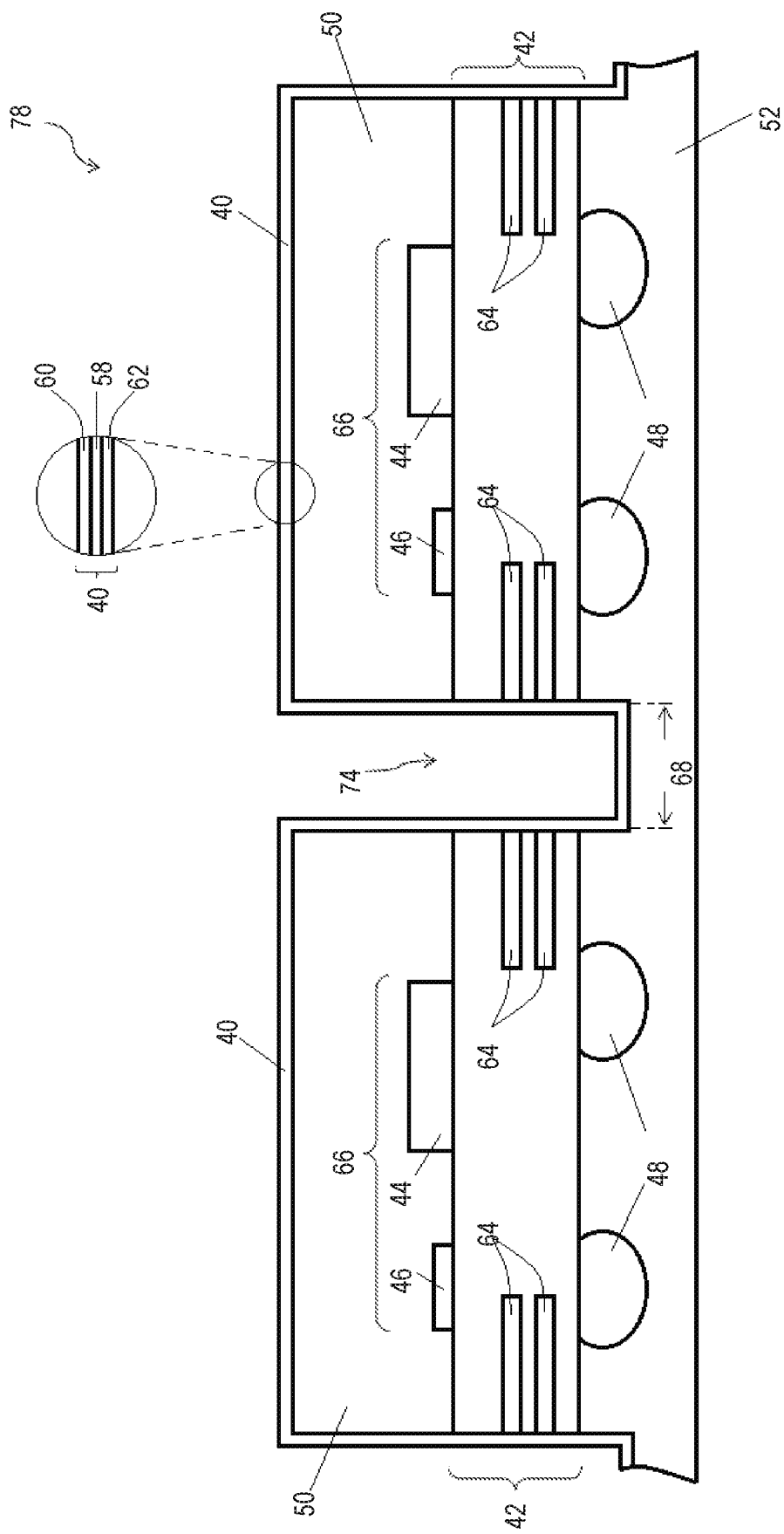

After the sub-dicing procedure is completed, the shielding structure 40 is applied to the double-sided package 70 to form a shielded electronic package 78, as depicted in FIG. 3F. The shielding structure 40 completely covers the top surface of the double-sided package 70, the side surface of the double-sided package 70 (not shown), and any exposed faces of each elongated cavity 74 without covering the bottom surface of the double-sided package 70. Since each grounded conductive element 64 is exposed to one elongated cavity 74, the shielding structure 40 is in direct contact with each grounded conductive element 64. As such, the shielding structure 40 is electrically grounded, which allows the shielding structure 40 to absorb any unwanted signals and ground the unwanted signals.

In one embodiment, the shielding structure 40 may be an electro/electroless plating process. Herein, the shielding structure 40 may include the seed layer 62, the first layer 58, and the second layer 60. The seed layer 62 may be formed of copper, aluminum, silver, gold, or other conductive materials; the first layer 58 may be formed of copper, aluminum, silver, gold, or other conductive materials; and the second layer 60 may be formed of nickel. The seed layer 62 directly and completely covers the top surface of the double-sided package 70, the side surface of the double-sided package 70 (not shown), and any exposed faces of each elongated cavity 74 without covering the bottom surface of the double-sided package 70. The first layer 58 is formed over the seed layer 62, and the second layer 60 is formed over the first layer 58. In some applications, the seed layer 62 may be omitted. In such case, the first layer 58 directly and completely covers the top surface of the double-sided package 70, the side surface of the double-sided package 70 (not shown), and any exposed faces of each elongated cavity 74 without covering the bottom surface of the double-sided package 70. The second layer 60 is formed over the first layer 58. In another embodiment, the shielding structure 40 may be formed by a sputter plating process and the shielding structure 40 includes stainless steel materials.

Figure 3G:
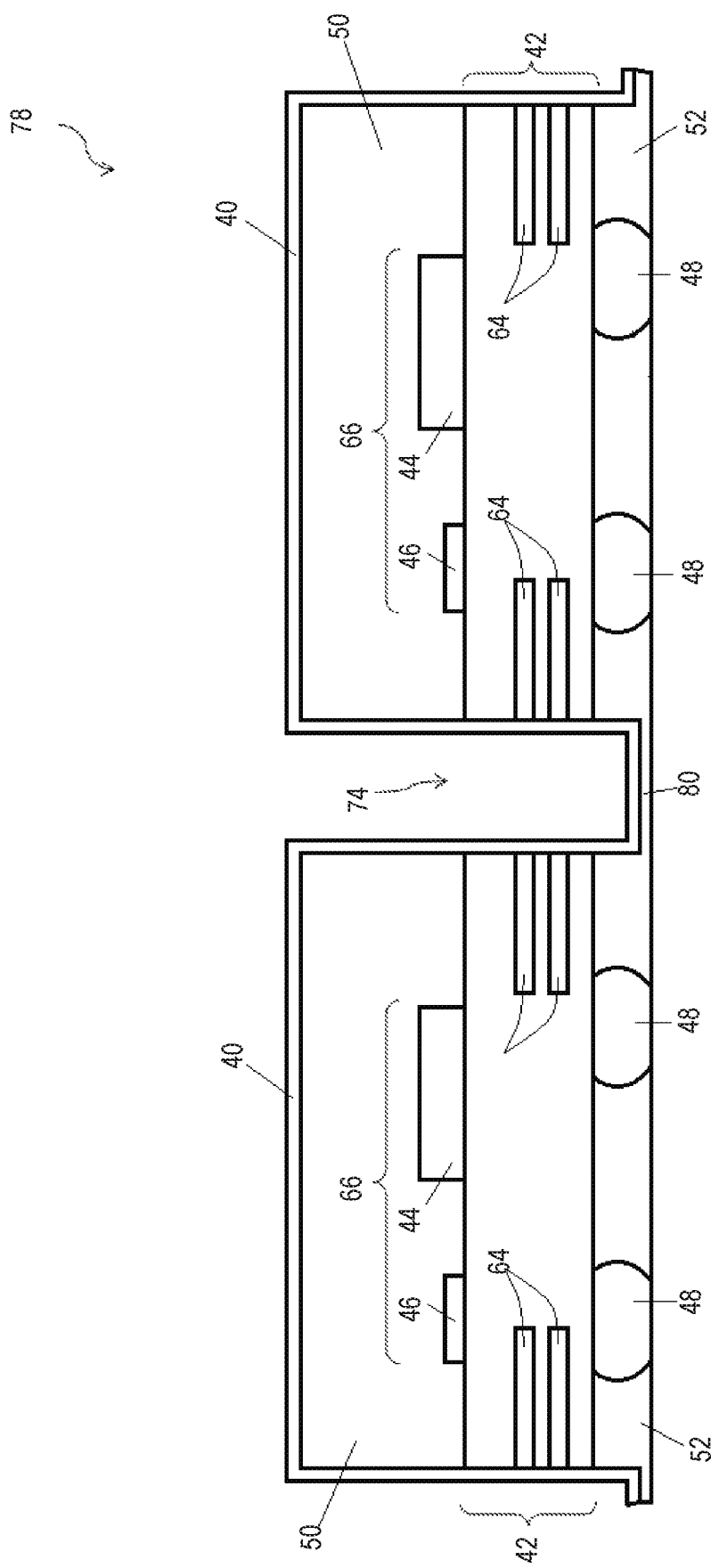

As illustrated in FIG. 3G, depending on a thickness of the second mold compound 52, a thinning step may be utilized to expose a bottom portion of each module contact 48. The thinning procedure may be done with a mechanical grinding process. Since the elongated cavity 74 does not extend vertically beyond the module contacts 48, when the bottom portion of each module contact 48 is exposed, there is still a bridge portion 80 of the second mold compound 52 underneath the elongated cavity 74. This thinning step does not reach the bottom of the elongated cavity 74 or the shielding structure 40.

Figure 3H:
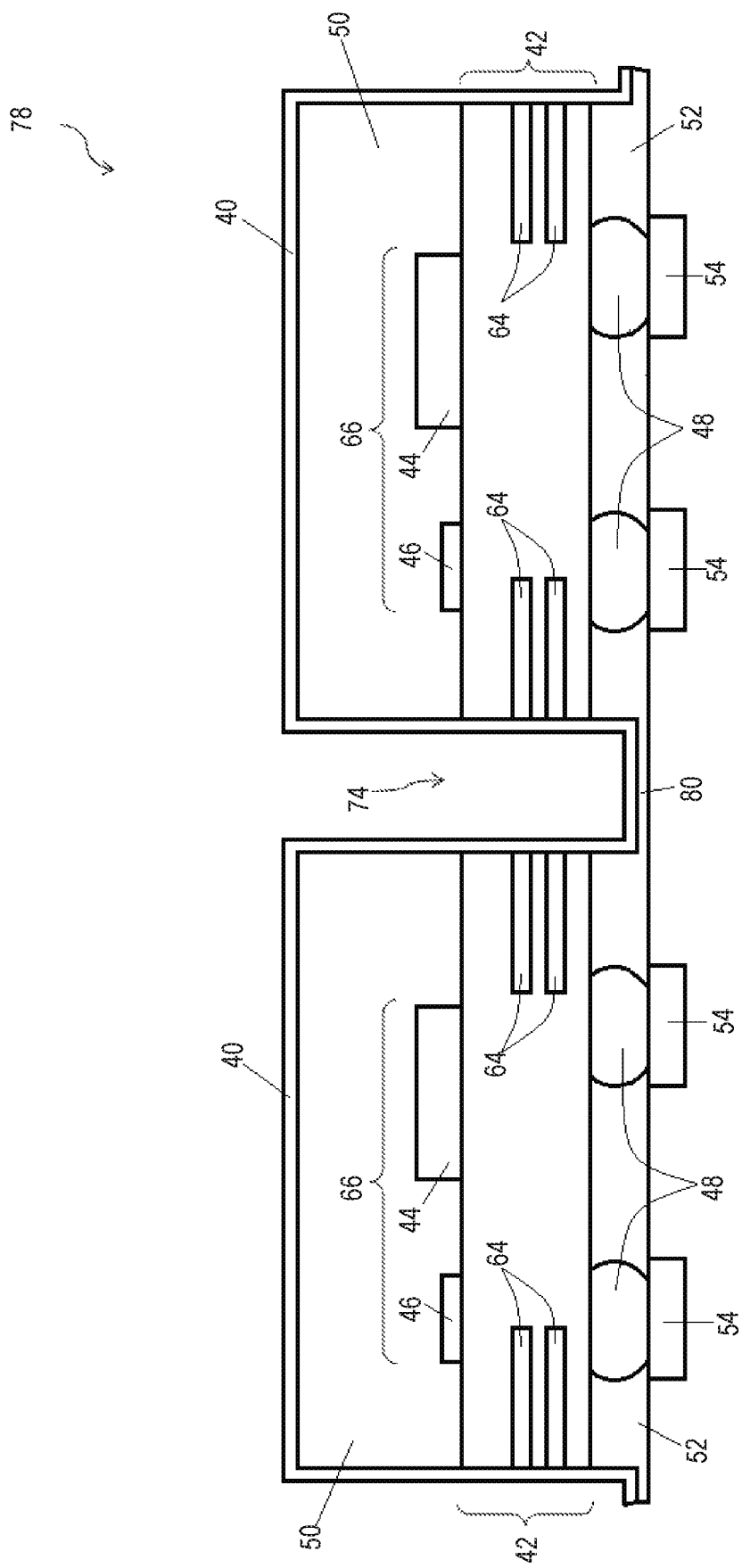

In some applications, a number of the external contacts 54 may be formed at the bottom surface of the second mold compound 52, as illustrated in FIG. 3H. Each external contact 54 is in contact with the exposed bottom portion of a corresponding module contact 48. The external contacts 54 may be formed of solder alloys, such as tin or tin alloys, by a standard bumping procedure.

Figure 3I:
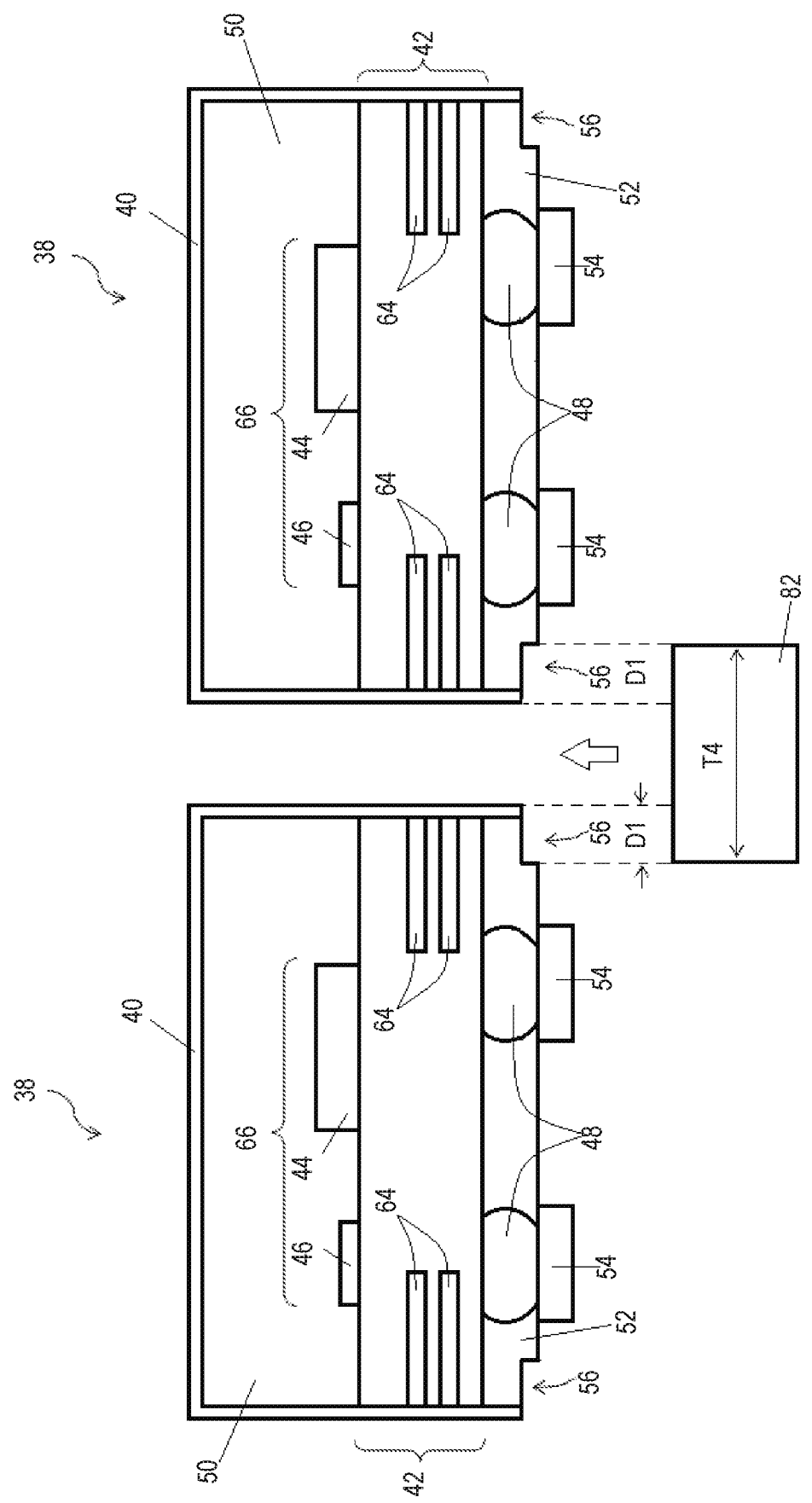

Finally, the shielded electronic package 78 is singulated into a number of the shielded electronic modules 38 as depicted in FIG. 3I. The singulation of the shielded electronic package 78 is provided by dicing with a second blade 82 from the bottom surface of the second mold compound 52 towards the elongated cavity 74. The singulation step is performed from the bridge portion 80 underneath the elongated cavity 74 until reaching the bottom of each elongated cavity 74 to fully separate the shielded electronic modules 38. In this manner, because the second blade 82 is performed from an opposite direction as the first blade 76, the second blade 82 does not need to fit into the elongated cavity 74 formed by the first blade 76. Consequently, the second blade 82 is not subject to size constraints regarding tolerance with the width of the elongated cavity 74 and the thickness of the shielding structure 40. Further, because the second blade 82 does not pass through the elongated cavity 74, it then less likely to cause a peeling or delamination of the thin shielding structure 40 within the elongated cavity 74.

In one embodiment, the second blade 82, which is utilized to separate the shielded electronic modules 38, may have a thickness T4 larger than the thickness T3 of the first blade 76 (wider than the elongated cavity 74 formed by the first blade 76). For one instance, the first blade 76 may have the thickness T3 ranging from 200 um to a 210 μm, and the second blade 82 which is performed from the opposite direction, may have the thickness T4 between 200 μm to 250 μm. As such, the recesses 56 may be formed at the bottom periphery of the second mold compound 52 associated with the corresponding shielded electronic module 38. Each recess 56 may have the horizontal depth D1 between 1 μm and 35 μm. Herein, the shielding structure 40 completely covers the top surface of the shielded electronic module 38, extends over the side surface of the shielded electronic module 38, and terminates at the recesses 56. The recesses 56 and the bottom surface of the shielded electronic module 38 are exposed and not covered by the shielding structure 40. In some alternative embodiments, the singulating step may be performed utilizing alternative methods, such as diamond cutting, laser cutting, etc. performed from the bottom surface of the second mold compound 52 towards the elongated cavity 74.

Those skilled in the art will recognize improvements and modifications to the preferred embodiments of the present disclosure. All such improvements and modifications are considered within the scope of the concepts disclosed herein and the claims that follow. Additionally, any steps or processes discussed herein are not intended to be restrictive with regard to a particular sequence and those having skill in the art will recognize where certain steps may be performed in various alternative sequences.

What is claimed is:

1. An apparatus comprising:
    a module comprising a module substrate, at least one electronic component, a first mold compound, and a second mold compound, wherein:
        the at least one electronic component is attached to a top surface of the module substrate;
        the first mold compound resides over the top surface of the module substrate and encapsulates the at least one electronic component, and the second mold compound resides over a bottom surface of the module substrate, wherein the second mold compound includes at least one recess that is at a bottom portion of the second mold compound and extending inwardly from a side surface of the second mold compound; and
        a top surface of the module is a top surface of the first mold compound, a bottom surface of the module is a bottom surface of the second mold compound, and a side surface of the module is a combination of a side surface of the first mold compound, a side surface of the module substrate, and the side surface of the second mold compound; and
    a shielding structure completely covering the top surface of the module, extending over the side surface of the module until reaching the at least one recess, wherein the shielding structure is electrically grounded.

2. The apparatus of claim 1 wherein the module further comprises a plurality of module contacts formed at the bottom surface of the module substrate, wherein the second mold compound encapsulates sides of each of the plurality of module contacts, such that a bottom portion of each of the plurality of module contacts is not covered by the second mold compound.

3. The apparatus of claim 1 wherein the at least one recess and the bottom surface of the module are exposed and not covered by the shielding structure.

4. The apparatus of claim 1 wherein the shielding structure comprises:
    a first layer completely covering the top surface of the module, extending over the side surface of the module until reaching the at least one recess, wherein the first layer is formed of copper, aluminum, silver, or gold; and
    a second layer over the first layer and formed of nickel.

5. The apparatus of claim 4 wherein a thickness of the first layer is between 0.5 μm and 16 μm, and a thickness of the second layer is between 0.5 μm and 3 μm.

6. The apparatus of claim 1 wherein the shielding structure comprises:
    a seed layer completely covering the top surface of the module, extending over the side surface of the module until reaching the at least one recess, wherein the seed layer is formed of copper, aluminum, silver, or gold;
    a first layer over the seed layer and formed of copper, aluminum, silver, or gold; and
    a second layer over the first layer and formed of nickel.

7. The apparatus of claim 1 wherein the shielding structure comprises stainless steel materials.

8. The apparatus of claim 1 wherein the at least one recess has a horizontal depth measuring from an outer side surface of the shielding structure between 1 μm and 35 μm.

9. The apparatus of claim 1 wherein the module substrate further comprises at least one grounded conductive element, wherein the at least one grounded conductive element is positioned at a periphery of the module substrate and exposed at the side surface of the module substrate, such that the shielding structure is in contact with the at least one grounded conductive element.

10. The apparatus of claim 1 wherein the module further comprises a plurality of external contacts, wherein each of the plurality of external contacts is connected to a corresponding module contact at the bottom surface of the second mold compound.

* * * * *